United States Patent [19]

Hoshino

[11] Patent Number: 4,982,159

[45] Date of Patent: Jan. 1, 1991

[54] IMAGE DISTORTION CORRECTING METHOD APPLIED TO AN NMR IMAGING APPARATUS

[75] Inventor: Kazuya Hoshino, Tokyo, Japan

[73] Assignee: Yokogawa Medical Systems, Limited, Tokyo, Japan

[21] Appl. No.: 320,266

[22] PCT Filed: Jul. 16, 1987

[86] PCT No.: PCT/JP87/00518
§ 371 Date: Jan. 10, 1989
§ 102(e) Date: Jan. 10, 1989

[87] PCT Pub. No.: WO88/00453
PCT Pub. Date: Jan. 28, 1988

[30] Foreign Application Priority Data

Jul. 16, 1986 [JP] Japan .................... 61-167560

[51] Int. Cl.⁵ .......................................... G01R 33/20
[52] U.S. Cl. ............................ 324/312; 364/413.13
[58] Field of Search ............... 324/309, 312, 307; 364/413.13, 413.22; 382/47

[56] References Cited

U.S. PATENT DOCUMENTS 4,585,992 4/1986 Maudsley et al. ............... 324/312
4,672,320 6/1987 Sekihara et al. ................. 324/312
4,724,388 2/1988 Sano et al. ....................... 324/309

FOREIGN PATENT DOCUMENTS 23499 2/1980 Japan .
148854 8/1984 Japan .

Primary Examiner—Michael J. Tokar
Assistant Examiner—Kevin D. O'Shea
Attorney, Agent, or Firm—Moonray Kojima

[57] ABSTRACT

A method for correcting distortion of a reconstructed image caused by non-uniformity of a static magnetic field in an NMR imaging apparatus, wherein the non-uniformity of a three-dimensional static magnetic field is measured, and the measurement data is stored in the form of a matrix having a size smaller than the size of a matrix used in image reconstruction; then, data on a two-dimensional plane, corresponding to a slice plane of the reconstruction image, is taken out from the matrix, and based on that data, a distortion correcting table is produced and is enlarged to agree with the size of the matrix used in image reconstruction, so that distortion of the reconstructed image is corrected using the enlarged distortion correcting table.

3 Claims, 4 Drawing Sheets

IMAGE DISTORTION CORRECTING METHOD APPLIED TO AN NMR IMAGING APPARATUS

BACKGROUND OF THE INVENTION

1. Field of Invention

This invention relates to an NMR (Nuclear Magnetic Resonance) image distortion correction method, and more particularly to such a method for correcting distortion of a reconstructed image caused by non-uniform static magnetic field.

2. Discussion of the Prior Art

An NMR imaging apparatus includes a magnetic unit having a static magnetic field coil for generating an uniform static magnetic field and a gradient magnetic field coil for generating a magnetic field whose direction coincides with the direction of the static magnetic field and which has a linearly extending gradient in each of the x, y and z directions. The NMR imaging apparatus further includes a transmitter/receiver unit for applying high frequency pulses (i.e. high frequency electromagnetic waves) to a body being examined, which body is disposed in the magnetic field generated by the magnetic unit, and for detecting an NMR signal from the body being examined; and a control/image processing unit for controlling operations of both the transmitter/receiver unit and the magnetic unit and for reconstructing the image by processing the detection data. In such an NMR imaging apparatus, a static magnetic field of a predetermined strength is formed by the static magnetic field in a predefined space in which the body being examined is placed, and an excitation pulse sequence and a gradient magnetic field sequence, according to the Fourier method, for example, are executed under control of the control/image processing unit to thereby measure the NMR signal. Based on the resulting data, an image of a cross-section of the body being examined is the reconstructed.

In this case, should the static magnetic field be non-uniform, the reconstruction image contains distortions, such as positional distortion and density distortion. In order to prevent such distortions, it is necessary to use a magnetic unit which generates a highly uniform static magnetic field. However, such a magnetic unit is expensive. Furthermore, the location of such a unit is restricted to a place where the amount of magnetic material is limited.

Furthermore, although it is desired that the lowest possible reading gradient be used so as to improve the Signal to Noise (S/N) ratio of the image, the distortion of the image increases as the reading gradient is reduced. Thus, under present circumstances, the reading gradient cannot be lowered to the limit determined by the echo signal time and the spatial resolution. However, despite the presence of such non-uniform static magnetic field, methods have been proposed for reducing image distortion, although the prior art methods have all been unsatisfactory.

In one conventional method, the image distortion is corrected in such a manner that the non-uniformity of the static magnetic field in three-dimensional space is measured in advance and then the image distortion is corrected by using data obtained upon measurement. (see IEEE Transaction on Medical Imaging, Vo. Ml-4, No. 4, Dec. 1986, pp 193 to 199).

In another conventional method, with an expression representing the static magnetic field as a function of the three-dimensional space, the non-uniformity of the static magnetic field in a desired scan plane is computed and then the image distortion is corrected using the computed value.

The former method is not practical in view of the fact that the amount of data becomes too voluminous if the distribution data representative of the non-uniformity in the three-dimensional static magnetic field is given as being the same size as the matrix of the image reconstruction (e.g. $128^3$ to $256^3$).

On the other hand, the latter method is not suitable for high speed on-line image correction, since a large amount of computation is involved due to the inclusion in the expression of high order terms representing the non-uniformity of static magnetic field which cannot be corrected with a shim coil.

SUMMARY OF THE INVENTION

An object of the invention is to provide an useful method of correcting the reconstructed image distortion caused by a non-uniform static magnetic field.

According to the invention, there is provided an image distortion correction method which can be used in NMR imaging devices, for correcting distortion of the reconstructed image caused by non-uniformity of the static magnetic field. The method comprises the steps of (a) measuring the non-uniformity of the three dimensional static magnetic field and storing the measurement data in an area of the memory in a computer in the form of a matrix, which matrix has a size smaller than the size of the matrix used in image reconstruction;

(b) taking out data on a two-dimensional plane corresponding to a slice plane of the reconstructed image, from the area of the computer memory representing the matrix in which the measurement data is stored and producing a distortion correcting table based on the data thus taken out;

(c) enlarging the distortion correcting table to agree with the size of the matrix used in the image reconstruction; and (d) correcting the distortion of the reconstructed image by using the enlarged distortion correcting table.

DETAILED DISCUSSION OF THE PREFERRED EMBODIMENTS

Figure 1:
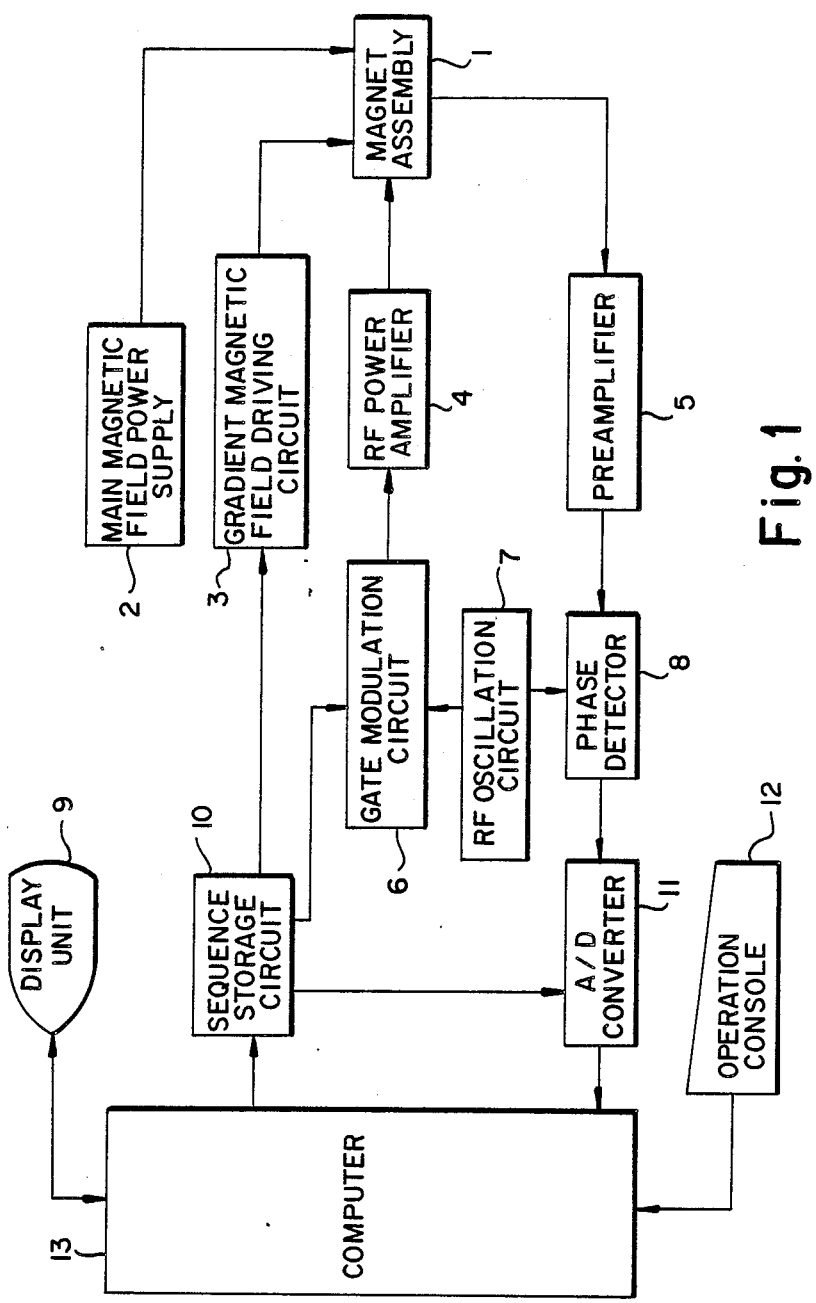
FIG. 1 is a block diagram depicting an NMR imaging apparatus in which the correcting method of the invention can be used.

Turning now to FIG. 1, a magnetic assembly 1 is depicted having a space in the interior thereof for receiving a body to be examined. Around the space are disposed a static magnetic field coil for applying a static magnetic field to the body; x, y, and z gradient magnetic field coils for applying gradient magnetic fields; a RF transmission coil for applying high frequency pulses to excite the spins of specific atomic nuclei within the body; and a reception coil for detecting the resulting NMR signals (these coils are not shown in the drawing for clarity of disclosure). The static magnetic coil, gradient magnetic coil, RF transmission coil, and reception coil are connected, respectively, to a main magnetic field power supply 2, a gradient magnetic field driving circuit 3, an RF power amplifier 4 and a preamplifier 5.

In response to instructions fed from a computer 13, sequence storage circuit 10 operates the gradient magnetic field driving circuit 3 and gate modulation circuit 6 in accordance with a sequence which has been stored in circuit 10 in advance, to generate a gradient magnetic field and high frequency pulses. A phase detector 8 carries out phase detection of the NMR signal detected by the reception coil and fed through preamplifier 5 by using an output signal fed from RF oscillation circuit 7 as a reference signal, and then feeds the resultant phase detected signal to an A/D converter 11. A/D converter 11 carries out analog to digital conversion of the phase detected signal and inputs the resultant converted digital signal to computer 13. Data is exchanged between operation console 12 and computer 13 and computer 13 causes switching of operational modes of sequence storage circuit 10 and rewriting of the memory in circuit 10 in order to execute various scanning sequences. Computer 13 implements arithmetic operations to reconstruct the image using data from the A/D converter 13. The computer 13 performs distortion correction with respect to the reconstructed image in accordance with the invention method to be described hereinbelow, including the step of placing the distribution data in an area of the computer memory in the form of a matrix which is smaller than the matrix used for image reconstruction and then outputs the distortion corrected reconstructed image to a display unit 9.

Image distortion operation is performed in (1) a calibration section for obtaining distribution data representing non-uniformity of the static magnetic field, and in (2) a correction section for implementing correction of the image data based on the distribution data. Both the calibration section and the correction section are provided within computer 13.

The operations performed in the calibration section are off-line processing, in which the frequency of the operation is low. Thus, time and complexity of these operations are not a matter of concern.

On the other hand, the operations performed in the correction section are on-line processing. Thus, the operations should be performed as simply as possible and with the number of operations held to a minimum.

Figure 2:
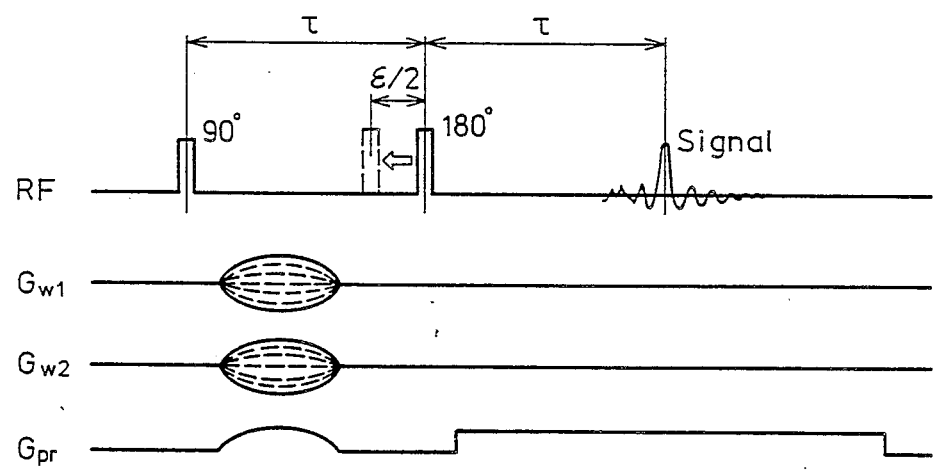
FIG. 2 is a wave chart depicting the pulse sequence for measuring non-uniformity of static magnetic field.

FIG. 2 depicts an example of a pulse sequence performed by the calibration section for measuring the static magnetic field non-uniformity. The pulse sequence is analogous to the pulse sequence of the Fourier method, which indicates scanning of a predetermined phantom. As a result of the scanning, there are measured (1) scanning data in which the duration between the 90° pulse to the 180° pulse and the duration between the 180° pulse and the spin echo center, are $\tau$ in both instances; and (2) scanning data in which the above described two durations are $\tau - \epsilon/2$ and $\tau + \epsilon/2$, respectively.

Based upon the two groups of data thus measured, two images are reconstructed. From the phase difference $\phi(x,y,z)$ between these two complex images, the distribution data $D(x,y,z)$ representing the non-uniformity of the static magnetic field is obtained on the basis of equation (1) given below.

$$D(x,y,z) = \phi(x,y,z)/2\tau\alpha\epsilon \quad (1)$$

wherein $\alpha$ is the magnetic rotational ratio.

Another method for obtaining the non-uniformity of the static magnetic field comprises carrying out warp with respect to three directions and reading out signals without subjecting the reading gradient whereby non-uniformity of the static magnetic field is obtained from the frequency of an NMR signal produced from each pixel.

The above mentioned two types of measurements use phantoms which cover the entire region of the static magnetic field where the nonuniformity is to be measured. It should be noted, however, that in the invention, the method for measuring the non-uniformity of the static magnetic field is not limited to a specific type of measuring method; rather, any suitable type of measuring method may be used.

If the thus measured distribution data representative of the non-uniformity of the three dimensional static magnetic field is stored in the memory of computer 13 in an area thereof representing a matrix of the same size as that used for image reconstruction, sampling results in the storage of only increments of the total amount of data and is thus not usable from a practical standpoint.

Thus, in the invention, when storing the measured distribution data in the memory of computer 13, the distribution data is reduced and stored in an area of the memory representing a matrix having a size which is smaller than that used for image reconstruction. This reduction is carried out by appropriate software instructions.

Then, the distribution data representative of the non-uniformity can be sampled, for example, at an interval of 5 to 10 mm, and using a reduced matrix size, it has been found that the volume of data is within a range which can be readily handled by currently used NMR imaging systems. For example, with a sampling interval of 7 mm and a reduced matrix of $64^3$ which covers 262 K points, a cubic region of 450 mm can be covered.

Figure 3:
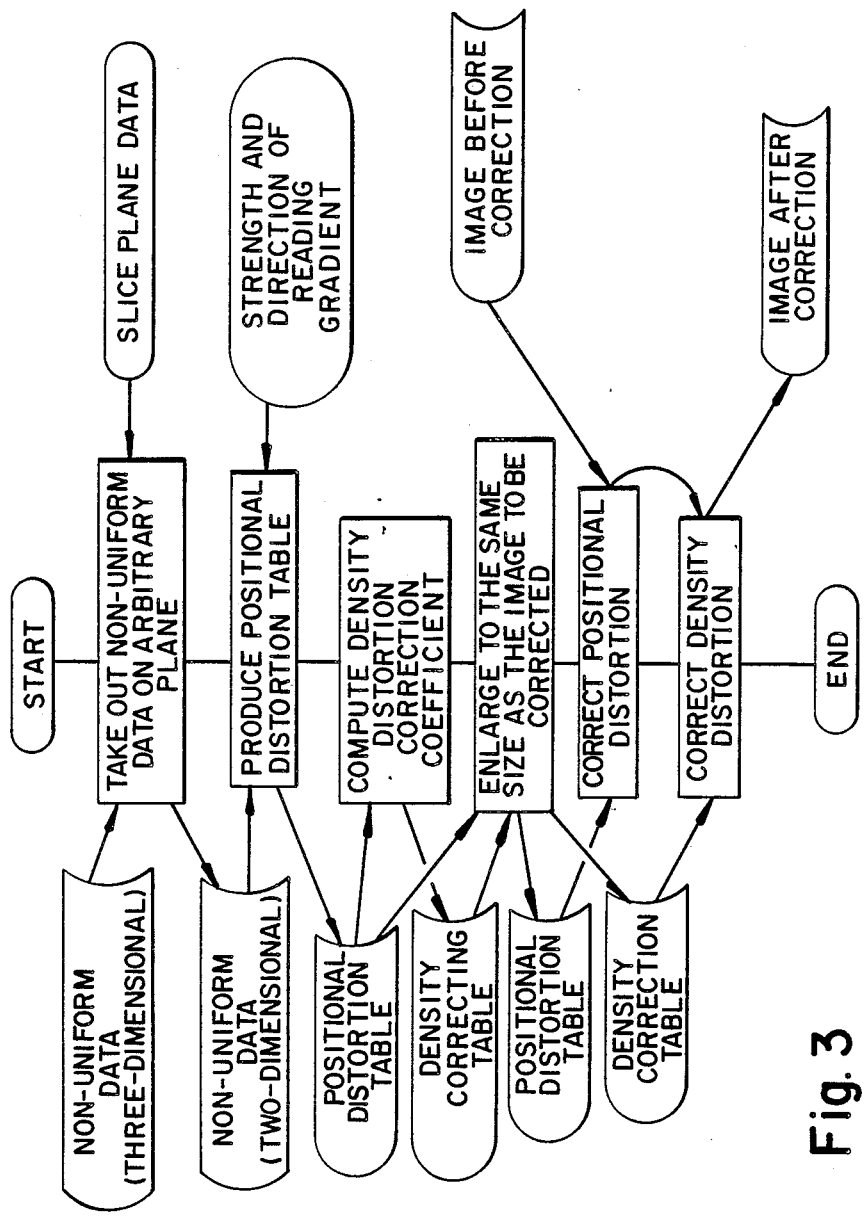
FIG. 3 is a flow chart depicting the image distortion correction steps of the invention.

FIG. 3 is a flow chart depicting distortion correction of the reconstructed image. Initially, two dimensional static magnetic field non-uniformity distribution data on the plane corresponding to a slice plane of the reconstructed image to be corrected is taken out from the three-dimensional static magnetic field non-uniformity distribution data stored in advance in the above discussed reduced matrix. At this time, interpolation may be carried out as the case demands. Next, a positional distortion table is produced from the two-dimensional distribution data on the basis of the reading gradient direction and the intensity data at the time the image data is collected. This positional distortion table is such as to store data indicative of a position to which each pixel is shifted due to the non-uniformity of the static magnetic field. The positional distortion due to the non-uniformity of the static magnetic field occurs in only the reading direction according to the spin warp method. Its magnitude $S(u,v)$ can be represented by express (2) below:

$$S(u,v) = D(u,v)g_{pr} \quad (2)$$

wherein $D(u,v)$ is the magnitude of the non-uniformity of the static magnetic field, and $g_{pr}$ is the magnitude of the reading gradient.

Accordingly, assuming that the u-axis is the reading axis, then point $(u,v)$ is shifted to the position defined by $(u+S(u,v), v)$.

Next, a density correction table is produced from the positional distortion data. Generally, if a positional distortion is caused by shifting from (u,v) to (u', v'), a density distortion is correspondingly produced in reverse proportion to the Jacobian J(u,v) represented in equation (3).

$$J(u,v) = \frac{\partial u'}{\partial u} \frac{\partial v'}{\partial v} - \frac{\partial u'}{\partial v} \frac{\partial v'}{\partial u} \quad (3)$$

In order to correct the density distortion, while obtaining density correction coefficient J(u,v) corresponding to the positional distortion, the density distortion correcting table is produced. When this is done, the density correction coefficient J(u,v) is obtained by way of a numerical differential, since the positional distortion is not given by numerical equations.

The positional distortion table and the density correction table thus obtained are based on the reduced matrix. Thus, both the matrix size and the pixel size are different from those in the image to be corrected. After the matrix and pixel sizes in those tables are rendered coincident with the size of the image to be corrected according to a prescribed interpolation, those are used for correcting the image. The interpolation may be by any known interpolation method, such as comparing the image size to be corrected to the size desired and then using the difference to control the changing of the image size, or by using a computer having a desired image size stored in a memory and changing the image size to be corrected against that size stored in the memory.

Figure 4:
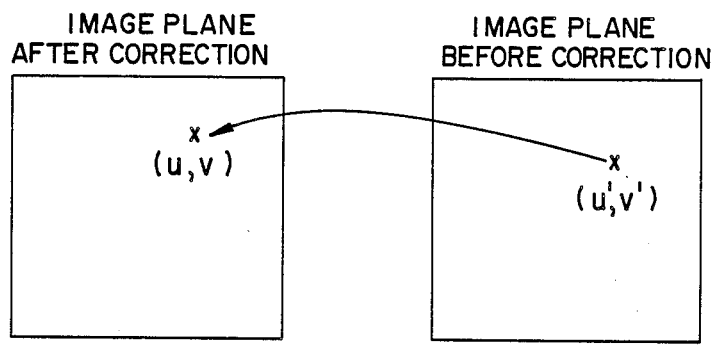
FIGS. 4 and 5 are diagrams for explaining the correction of the positional distortion of the image.

FIG. 4 conceptually illustrates the positional distortion correction. From the positional distortion table, it is recognized that the pixel to be positioned in a coordinate (u,v) after correction is positioned in the coordinate (u',v') before correction, so that the image data in the coordinate (u',v') corresponding to the image before correction may be stored in the coordinate (u,v) on the image plane after correction. Generally, the coordinate (u',v') does not agree accurately with the pixel position. Therefore, the latter is obtained from the neighboring pixels through prescribed interpolation.

After correcting the positional distortion in such a way, the density distortion correction coefficient J(u,v) is multiplied to each of the pixels. Then, an image is obtained in which both the positional distortion and the density distortion are corrected.

In the positional distortion correction, if FOV of an image before and after correction are equal to each other, the position of the data to be taken out may be shifted to be out of the image. For this reason, it is desirable that the FOV of the image before correction be set to be larger to some extent than that of the image after correction. It is to be noted that a rotary type correction, to be described below, may be used solely or in combination with the abovedescribed FOV manipulation.

Figure 5:
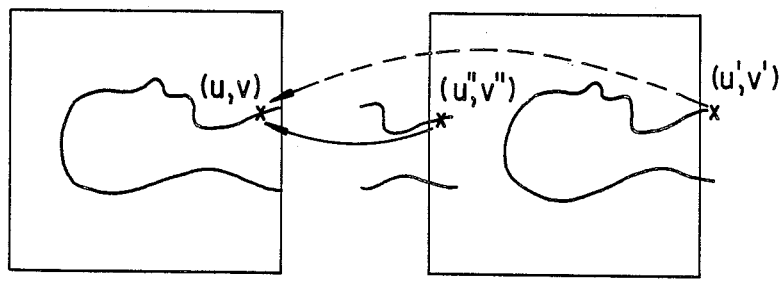

FIG. 5 illustrates the rotary type correction method, wherein it is assumed that the same image is arranged in a repetitive manner in the region out of the image, and data is taken out from coordinate (u", v") and is placed in coordinate (u,v). This utilizes the fact that the image has a rotary-like characteristic, in accordance with the Fourier method.

The invention is not limited to the embodiments just described; rather, it is applicable to the correction of cubic imaging distortion according to a three-dimensional method. In such a case, in FIG. 3, while not taking out the non-uniformity data in an arbitrary plane, the processing to be executed thereafter may be carried out entirely using the three dimensions. However, the three-dimensional table in which the enlarged positional distortion and the density correction coefficient might be extremely large. Thus, without producing tables, the corrections should be carried out while obtaining the positional distortion and the value of the density correction coefficient during the course of the calculation of correction, or other alternative manipulation, should be taken out. Furthermore, a considerably large part of the method according to the invention can be commonly used for correction of image distortion caused by non-linearity of the gradient magnetic field. The distortion caused by non-linearity of the gradient magnetic field is usually in addition to the distortion caused by the non-uniformity of the static magnetic field. Therefore, by adding the distortion data caused by the non-linearity of the gradient magnetic field to the positional distortion table shown in FIG. 3, the processing to be executed thereafter can be commonly executed.

As described above, according to the invention, the positional distortion and the density distortion can be effectively eliminated with respect to an image on an arbitrary cross-sectional plane or cubic image with a proper memory quantity and amount of operations. As a result, even with the use of a magnet which is less uniform in generating static magnetic field, an image is obtained which is substantially equivalent to that obtained by using a highly uniform magnet. Accordingly, advantageously, using the same placing conditions, a less uniform and less expensive magnet can be used and the cost of the magnet can be substantially lowered. On the other hand, if the same magnet is used, the operating conditions can be reduced to be less fine, and thus effect savings in operating costs. Moreover, the S/N ratio of the reconstructed image is improved while the reading gradient is lowered.

Although the foregoing description refers to the best mode for carrying out the invention, it would be apparent to those skilled in the art to modify the invention in a variety of ways without departing from the spirit and scope of the invention as set forth in the appended claims.

What is claimed is:

1. An NMR image distortion correcting method for correcting distortion of a reconstructed image caused by non-uniformity of static magnetic field, comprising the steps of
    measuring the non-uniformity of a three-dimensional static magnetic field, and storing measurement data obtained thereby in the form of a measuring matrix having a size smaller than the size of a matrix used in image reconstruction;
    taking out data on a two-dimensional plane corresponding to a slice plane of the reconstructed image, from said measuring matrix and for producing a distortion correcting table based on said data thus taken out;
    enlarging said distortion correcting table to agree with the size of the matrix used in image reconstruction; and
    correcting the distortion of the reconstructed image with the use of the enlarged distortion correcting table.

2. An NMR image distortion correction method for correcting distortion of a reconstructed image caused by non-uniformity of static magnetic field, comprising the steps of measuring the non-uniformity of a three-dimensional static magnetic field and storing measurement data obtained thereby in the form of a measuring matrix having a size smaller than the size of a matrix used in image reconstruction;

taking out data on a two-dimensional plane corresponding to a slice plane of the reconstructed image, from said measuring matrix and for producing a positional distortion correcting table based on said data thus taken out;

enlarging said positional distortion correcting table to agree with the size of the matrix used in image reconstruction; and correcting the positional distortion of the reconstructed image using the enlarged positional distortion correcting table.

3. An NMR image distortion correcting method for correcting distortion of a reconstructed image caused by non-uniformity of static magnetic field, comprising the steps of measuring the non-uniformity of a three-dimensional static magnetic field and storing measurement data obtained thereby in the form of a measuring matrix having a size smaller than the size of a matrix used in image reconstruction;

taking out data on a two-dimensional plane corresponding to a slice plane of the reconstructed image, from said measuring matrix and for producing a positional distortion correcting table based on said data thus taken out;

producing a density correcting table from said positional distortion correcting table;

enlarging said positional distortion correcting table to agree with the size of the matrix used in image reconstruction;

enlarging said density distortion correcting table to agree with the size of the matrix used in image reconstruction; and correcting the positional distortion and the density distortion of the reconstructed image using the enlarged positional distortion correcting table and the enlarged density distortion correcting table.

* * * * *